United States Patent [19]

Schorr et al.

[11] 4,354,159
[45] Oct. 12, 1982

[54] PRESCRIPTION ATTENUATOR HAVING CASCADED L-PAD SECTIONS

[75] Inventors: Ian A. Schorr, Chicago; Mark J. Beegle, Lisle, both of Ill.

[73] Assignee: Rockwell International Corporation, El Segundo, Calif.

[21] Appl. No.: 230,215

[22] Filed: Feb. 2, 1981

[51] Int. Cl.³ .................. H03H 11/24; H03H 7/24
[52] U.S. Cl. .................... 330/86; 323/354; 333/81 R
[58] Field of Search ........ 333/81 R, 280, 297, 333/353, 354; 330/86, 282

[56] References Cited

U.S. PATENT DOCUMENTS 1,892,215  12/1932  Mathieu ............... 333/81 R X
3,590,366   6/1971  Vaughn ..................... 323/354
3,810,035   5/1974  Gundry ................... 330/282 X
4,091,333   5/1978  Thrap ...................... 330/86 X

FOREIGN PATENT DOCUMENTS 54-114159  9/1979  Japan ........................ 330/86

Primary Examiner—Paul L. Gensler
Attorney, Agent, or Firm—Bruce C. Lutz; Howard R. Greenberg; H. Fredrick Hamann

[57] ABSTRACT

A prescription attenuator comprising a plurality of cascaded L-pad sections coupled together to form an attenuator network wherein each cascaded section includes a single pole switch for activating its respective section. The network impedance values are selected so that single L-pad section activations produce actual attenuations slightly more than an ideal level of attenuation wherein multiple section activations tend to keep the error evenly distributed about the ideal level of attenuation.

6 Claims, 3 Drawing Figures

PRESCRIPTION ATTENUATOR HAVING CASCADED L-PAD SECTIONS

BACKGROUND OF THE INVENTION

The invention disclosed herein pertains in general to attenuators and in particular to a multiplicity of switchably activated L-type pads coupled together to form a network having selectable attenuation settings. Such attenuator networks which have precision graduated settings are commonly known as prescription attenuators.

Prescription attenuators find a variety of uses in the instrumentation field to establish precision voltage references and in the telecommunication field where, for instance, amplifiers are configured with prescription attenuation feedback networks to produce selectable gains for compensating the loss due to various telephone line lengths. In this manner, a single amplifier unit having a plurality of switchable gain settings may be utilized to match any one of a plurality of lines. In addition, if the line characteristics change because of replacement or degradation, a craftsman need only to select a new amplification setting rather than experiment with the gain of the amplifier to arrive at a proper level.

Prescription attenuators used in conjunction with amplifiers typically provide for manually setting the amplifier amplification by way of switches mounted in the amplifier front panel. The switches, traditionally of the double-pole type, connect sections of a constant resistance T-pad between the amplifier input and output to provide amplifier gains in proportion to the attenuation of the activated section. T-pad attenuators, having three resistive components are well known in the art. A plurality of T-pads are generally cascaded and the resistive components so chosen, that each T-pad section may be switchably connected into the feedback path. An overall amplifier gain results which is the product (db sum) of the gains attributable to each individually activated section.

The versatility of a prescription gain amplifier is enhanced in view that a craftsman may select any permutation of switch settings to obtain a desired gain. When utilized with T-pad sections this added versatility is not without the attendant disadvantage of having to extend at least three wires per double-pole switch to the module faceplate or facade where the switches are physically located. In a typical 24 db gain amplifier having 0.1 db resolution the number of interconnections for eight switches will normally be twenty-five but may range as high as thirty-two (depending on the number of common connections as will be discussed below). Recognizing the cost, labor and materials involved, attempts have been made to obviate the multiple interconnection disadvantage by locating the attenuator components on the faceplate. While this measure alleviates some of the problems, other difficulties, such as trouble shooting defective circuitry, arises out of this attempted solution.

The T-pad network configuration, when used in conjunction with amplifiers to produce prescription gain does exhibit a constant input and output impedance, but such a configuration has the offsetting disadvantage of producing a six db gain when all sections are in the nonactivated state. To overcome this aspect, additional loss is inserted either before or after the amplifier stage.

Accordingly, in attenuator networks, it would be highly desirable to substantially reduce the number of interconnections and the number of attenuator components (and thus cost), yet combine the feature of faceplate-mounted switches wired to the components located on the module board. With the foregoing in mind, it is a primary object of the present invention to provide an attenuator configuration having a plurality of coupled L-pad sections to form an attenuator network wherein each section may be switchably activated by way of a single-pole type switch thereby reducing the number of switch-to-front panel interconnections by approximately 50%.

It is a further object of the present invention to provide an attenuator arrangement wherein the section impedance ratios determine the criticality of the attenuator performance rather than the individual component values. The advantage of resistor impedance ratio matching lends itself well to the attendant advantage of thick film manufacture.

It is still a further object of the present invention to provide an attenuator arrangement having approximately 30% fewer components, thus requiring less space and resulting in a reduction in cost.

As a corollary to the foregoing, it is an object of the present invention to provide an attenuator arrangement, which when used with an operational amplifier to produce prescription gain, produces zero db gain with all attenuator sections nonactivated.

These as well as other objects and advantages will be more fully appreciated by referring to the detailed description which follows hereinafter together with the appended drawings.

BRIEF DESCRIPTION OF THE INVENTION

In accordance with the stated objects a multiple section L-pad attenuator is provided having switchably activated sections. When connected to a source voltage each L-pad section feeds a portion of the voltage to subsequent activated sections thereby providing attenuation. The various section resistive components are selected to produce an ascending inter-section ratio to minimize interference between sections in addition to achieving a desired mixture of individual section attenuations. Importantly, the L-pad sections are individually activated by a single-pole type switch to thereby minimize the number of switches and the switch-to-resistor wire connections.

In the preferred environment described hereinafter, the attenuator arrangement of the present invention is utilized as a feedback network with an operational amplifier to provide prescription gain settings. In accordance with the illustrated embodiment the amplifier output voltage is fed back to its inverting input attenuated by an amount which is dependent upon the attenuator switch settings.

DETAILED DESCRIPTION OF THE PREFERRED EMBODIMENT

It should be understood at the outset that while the present invention has special utility when used in conjunction with operational amplifiers a myriad of alternate applications may be envisioned by those skilled in the art. In order to maintain the input and output impedance characteristic of the L-pad ladder network it is preferred to feed the network with a low impedance source such as a transistor or a transformer. The output of the L-pad network should preferably be connected to a high impedance load such as a vacuum tube or a J-FET transistor. The foregoing suggestions are not exhaustive but rather suggest acceptable environments in which the present invention may be practiced.

Figure 1:
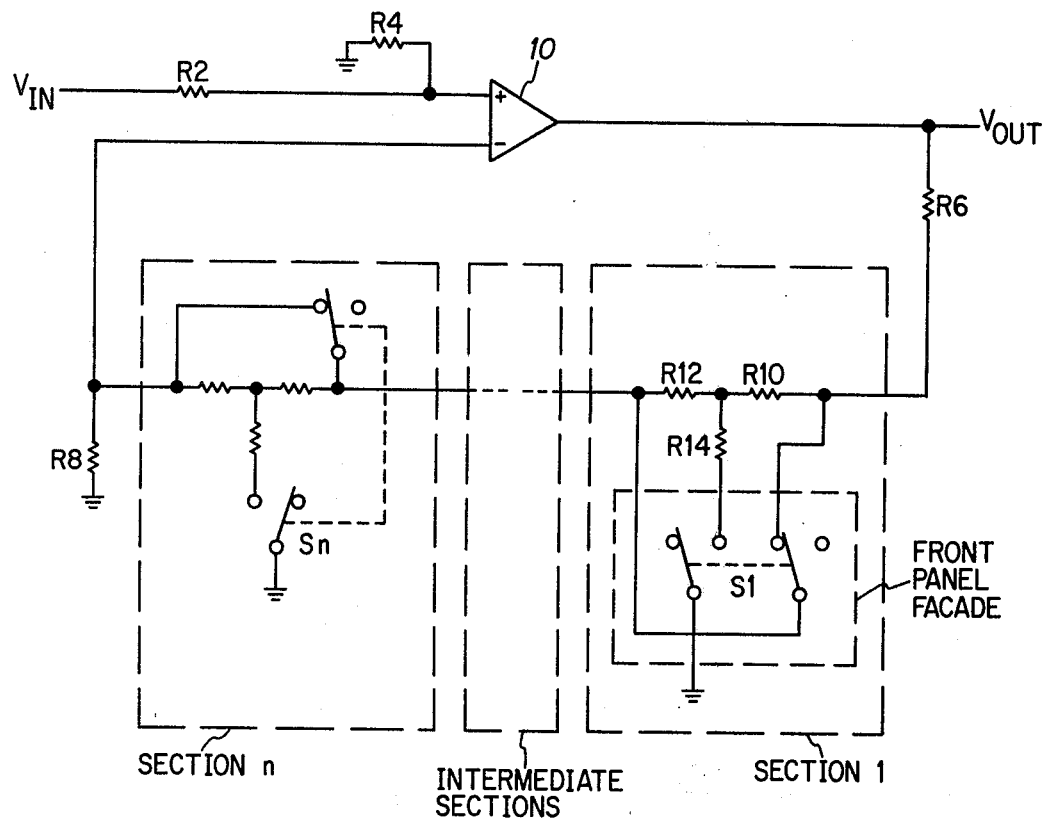
FIG. 1 is a schematic diagram illustrating a constant resistance T-pad feedback arrangement as known in the art.

In order to gain an understanding and appreciation of the present invention, there is shown in FIG. 1 an amplifier incorporating within its feedback path a trasditional T-pad attenuator arrangement. In particular, the resistors R2, R4, R6 and R8 and the various T-pad resistances are selected so that the amplifier 10 input and output impedances are always matched. Apart from the details of the illustrated feedback arrangements as disclosed herein, particular characteristics of feedback amplifiers will not be discussed as such information is well within the ambit of those skilled in the art and is thus beyond the necessary scope of this discussion. With reference again to FIG. 1, each T-pad section 1-n, when activated by the respective double-pole-double-throw (DPDT) switches S1-Sn, inserts within the feedback path a predetermined attenuation. For a given amplifier input voltage, the amplifier 10 must increase its output voltage to thereby overcome the inserted feedback attenuation such that the voltages appearing at the differential inputs of the amplifier 10 are equal—a known characteristic of operational amplifiers.

Section 1 of the first feedback T-pad section is switchably inserted within the feedback loop by way of DPDT switch S1. The switch S1 is shown in a position whereby serial resistors R10 and R12 are shorted and the shunt resistor R14 is open circuited so that the section is inactive and no attenuation is thereby produced within the section. As switch S1 is activated to its alternate position, the associated T-pad is inserted within the feedback loop to thereby attenuate the amplifier 10 output voltage.

Importantly, it should be noted that the T-pad configured attenuator cannot be equipped with one single-pole-single-throw (SPST) switch. Typically, in rack amount applications each T-pad switch S1-Sn is mounted on a panel facade to allow an operator easy access to selectively choose a particular amplifier gain. The switches S1-Sn, being remotely located from the amplifier circuitry, are connected thereto by four connecting wires per switch as illustrated in T-pad section 1. In section n the DPDT switch Sn is drawn to show functionality whereas section 1 is drawn to emphasize the wire connections between the switch S1 and the associated T-pad components.

Figure 2:
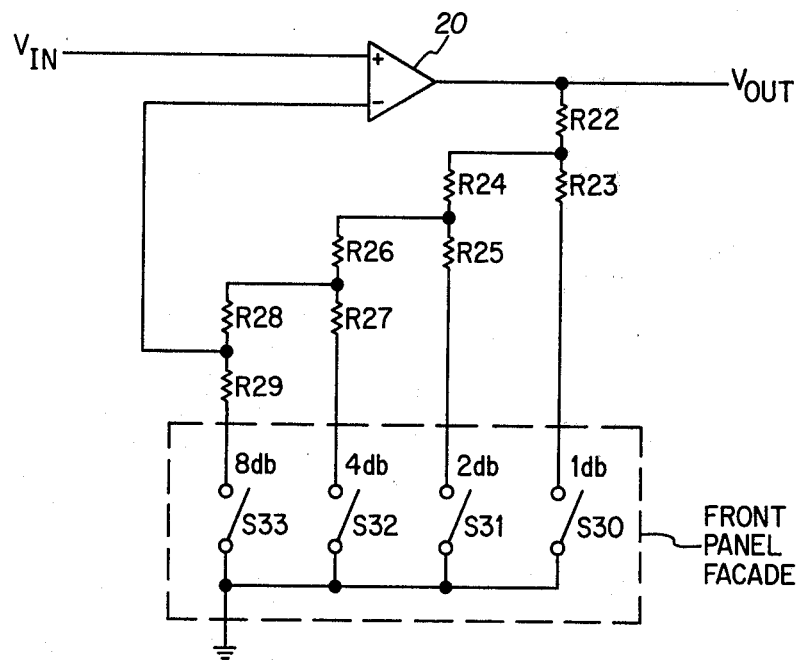
FIG. 2 is a detailed schematic diagram illustrating an operational amplifier feedback environment in which the present invention may advantageously be practiced.

Turning now to FIG. 2 there is shown a feedback amplifier arrangement providing an environment for the present invention wherein such configuration produces all the advantages of switchable gain settings yet requires only two connecting wires per remotely located switch. Preferably, and for noise considerations, each grounded switch pole may be tied together resulting in a single return wire grounded at the amplifier location. Similarly, the number of switch wire connections in FIG. 1 may be reduced, however, even with such switch grounds commoned, the utilization of the present invention allows the number of interconnecting wires to yet be reduced by almost 66%. It is also evident that by using one SPST switch per attenuator section rather than a DPDT switch, the number of poles (and thereby cost) per switch is reduced by 50%.

The L-pad attenuator arrangement of the present invention as shown in FIG. 2 is comprised of a plurality of resistor dividers connected from the amplifier 20 output to the inverting input so that the amplifier output voltage feeds the first resistor divider and each subsequent divider derives is voltage from the junction of the previous resistor divider. Each two-resistor divider section is actuated by a single pole switch which diverts a portion of the amplifier output current to ground through a resistor in accordance with the electrical resistance thereof.

For exemplary purposes, FIG. 2 illustrates a four section L-pad network ganged in a ladder-like manner. Assuming the differential amplifier 20 is ideal, it is seen that if all switches S30-S33 are open no amplifier output current flows through resistors R22, R24, R26 or R28 and thus the amplifier output voltage is equivalent to its input voltage. Thus, in keeping with the objects of the invention the L-pad configuration produces zero db gain when all switches are nonactivated. As noted, this result is achieved because zero attenuation occurs with all switches open. In contradistinction, and as noted in FIG. 1, resistor R8 (necessary for maintaining proper network impedance balance) diverts a portion of the amplifier output current to ground irrespective of the switch setting. Thus, in the T-pad configuration the R2,R4 resistor arrangement must attenuate the input voltage an amount equivalent to the gain resulting from the presence of R8.

As one or more of the switches S30-S33 (of FIG. 2) are activated, a portion of the output amplifier current is diverted through the respective shunt resistors R23, R25, R27 and R29 to provide feedback attenuation. Consequently, the amplifier adjusts its gain to compensate the output voltage such that the differential inputs return to their quiescent state of zero difference voltage. It should be noted that the influence of each ladder section on the L-pad feedback arrangement is dependent on a portion of all other ladder sections irrespective of whether those sections are activated by their respective switches. For example if switch S32 alone is closed, the portion of output voltage fed back to the inverting input is expressed by the following equation:

$$V_{out} \frac{R27}{R22 + R24 + R26 + R27}$$

It is observed that the current drawn by the activated section depends upon all the previous section serial resistors (R22, R24, R26). The resistor values of each resistor divider section are selected such that the activation of a respective switch represents one amplifier gain and the activation of multiple switches produces another amplifier gain representative of the product (db sum) of gains atrributable to each activated section.

The number of resistor divider sections comprising the ladder network, and the resistor ratio relationship existing between such sections are dependent upon the maximum gain desired and the incremental resolution thereof. For instance, practical applications may require a 24 db maximum gain and a 0.1 db resolution. To achieve this result at least eight switches are required where each switch influences the overall db gain in increments of; 0.1, 0.2, 0.4, 0.8, 1.5, 3, 6, and 12. The resistor divider sections forming a part of the L-pad ladder network, as connected from the amplifier 20 output to the input, have increasing values of resistance. The two resistors of each divider section are chosen to approximate a predetermined gain when the divider is activated via its respective switch. The two resistors of subsequent adjacent dividers are chosen such that, upon activation thereof, the current drawn thereby is negligible with respect to the previous adjacent section so that the voltage levels of the previous adjacent divider are not thereby appreciably disturbed. This aspect of the present invention minimizes interference between sections due to one activated section loading down a previous section thereby pertubating the section attenuation.

Cascading resistor dividers to form the L-pad network thus requires a correspondng increase in resistor values when progressing from the amplifier output to its input. Assuming a gain of 4 db is desired, it is seen from FIG. 2 that only switch S32 should be closed. The sum of resistance R22, R24 and R26 comprise a total resistance equal to Rtotal. The amplifier gain is expressed as:

$$A4 = 1 + \frac{Rtotal}{R27}$$

Similarly, a desired gain of 8 db is expressed as:

$$A8 = 1 + \frac{Rtotal + R28}{R29}$$

Specific resistances could be selected to ideally achieve these individual gains if only one section were activated at a time. A desired gain of 12 db however, requires switches S32 and S33 to be closed at the same time. Such a gain can be expressed as:

$$A12 + \left(1 + \frac{Rtotal}{R27}\right)\left(1 + \frac{R28 + \frac{R27 \times Rtotal}{R27 + Rtotal}}{R29}\right)$$

Ideally, a 12 db gain should be the product of the 4 db and 8db gain equations above. An error that does exist is represented by the difference as shown:

$$\text{Error} = A12 - A4 \times A8 = -\frac{Rtotal}{R27} \times \frac{Rtotal}{R29}$$

It is seen that the error introduced by multiple switch settings is negative. This aspect can be interpreted as an actual gain which is smaller than the product of the individual section gains. As can be seen by the above equation the error can be made arbitrarily small by selecting resistors such that the result of the following equation is arbitrarily small:

$$\frac{Rtotal^2}{R27 \times R29}$$

Another expression for the 12 db gain error is:

$$\text{error} = A4 \times A8 - A12 = A8 \times \frac{Rtotal}{R27} \times \frac{1}{1 + \frac{R28 + R29}{Rtotal}}$$

As observed, the overall gain error is proportional to the subsequent section ladder gain. Inter-section isolation is a function of (R28+R29)/Rtotal.

The error in negative direction introduced by multiple switch settings is minimized by selecting particular divider ratios so that single switch activations produce slightly more gain than ideal. As a consequence, and advantageously, additional switch activations tend towards minimization of gain error. Specifically, the error introduced by multiple switch activations is a function of the section gain (Rtotal/R27) as well as a function of the inter-section isolation (R28+R29/Rtotal). Also, since it has been shown that multiple switch settings tend to produce a resultant gain somewhat lower than the calculated product of the activated section gains, the resistor values of single sections should be selected to produce a gain somewhat higher than desired so that when multiple sections are activated, the allowable error is always within a nominal limit. In practice, using 0.5% to 1% resistors, the words case total error is better than corresponding T-Pad arrangements using similar resistor tolerances.

Figure 3:
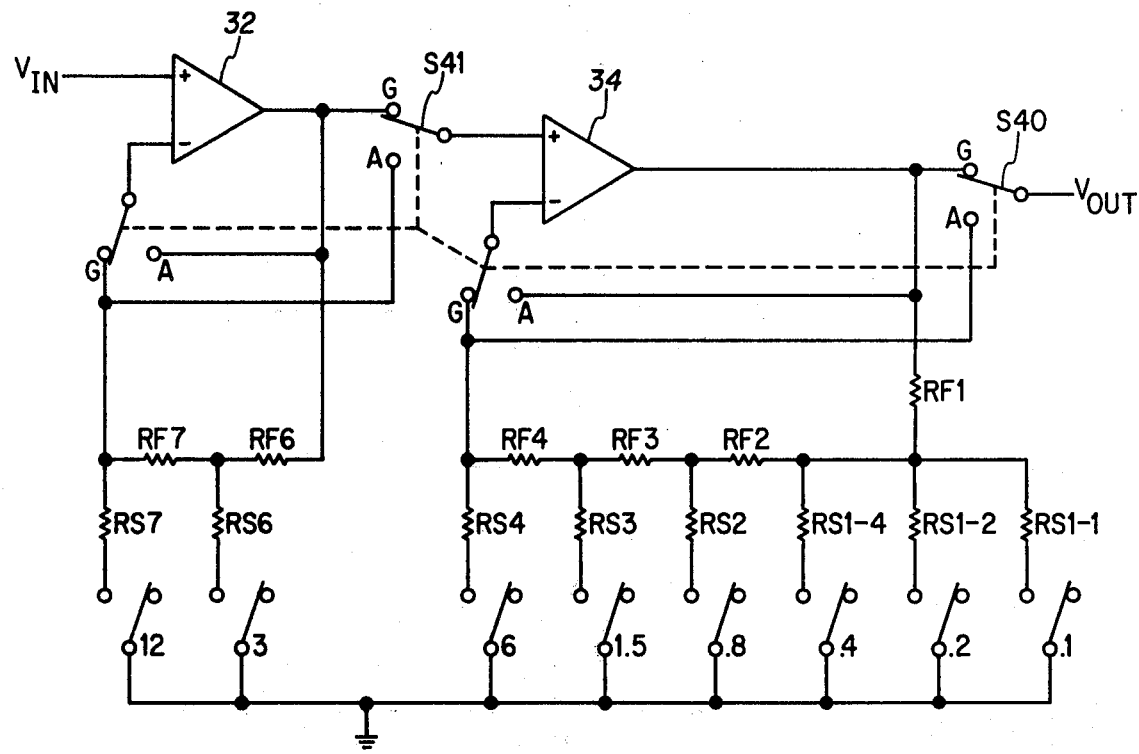
FIG. 3 is a schematic diagram of the preferred environment utilizing a multiple amplifier feedback configuration.

FIG. 3 illustrates the preferred embodiment of the present invention having a dual stage 24 db perscription gain amplifier the gain analysis of which is shown in the Table appended hereto. As indicated in the Table, the actual error resulting from particular switch combinations (of amplifier 34 stage) varies above and below the ideal gain. Significantly, each single switch setting results in a gain greater than a corresponding ideal gain; and as multiple switches are activated to incrementally increase the gain, the error from ideal diminishes and even becomes negative until a single high-order switch activation restores the error to a positive value. Owing to the fact that some error is existant, the proper resistor selection assures that the error is evenly distributed about the ideal value thus reducing the impact of the total error. It should also be noted that the amount of intentional error introduced into the design of each section generally increases with increasing stage gain. This aspect can be observed in the Table where single switch activations exist.

Because operational amplifiers do have a finite input impedance, the loading effect thereof is minimized if the output impedance of the L-pad network is substantially lower, for example, than 100 kilohm. With such a criterion, it should be appreciated that the maximum error from ideal occurs at a full gain of 9 db and amounts to 0.0299 db. Such an error does not include the error introduced by component tolerance which of course, is always existant and can be minimized by choosing a tighter resistor tolerance. Thus, if less gain error is desired, a larger input impedance of each L-pad should be used. Careful analysis of the preferred embodiment indicates that the overall dual stage gain error is naturally most sensitive to the resistor values of the higher gain stage 32 and more particularly to RF7 and RS7. Again, for an optimal minimization of gain error, these two resistors should be carefully selected for precise values.

In accordance with the foregoing, a similar analysis may be undertaken to select ladder values to minimize the gain error of amplifier stage 32.

As noted heretofore, a prescription gain amplifier having a large gain range and small incremental resolution requires a large number of resistor divider sections ultimately having unduly large resistor values. It should be understood that to minimize error introduced by multiple switch activations, each impedance, coupling the amplifier output current from one ladder section to a succeeding section, must increase in value. Thus, without multiple amplifier stages, the output impedance of the network, as seen by the amplifier input, would become unreasonably high. As noted, FIG. 3 illustrated the preferred embodiment of the present invention utilizing multiple amplifier stages thereby overcoming the need for extremely large resistance values. Because of the inherently large input impedance of the isolating operational amplifier, the one ladder network stage does not load down the other network stage and, therefore, interstage errors are eliminated. The detailed discussion of the single stage prescription gain amplifier as hereinbefore set forth applies to the multiple stage amplifiers as shown in FIG. 3 and thus need not be further detailed.

It should be noted that the resistor dividers near the output of amplifier 34 have been modified to thereby eliminate the small value resistors without substantially affecting the operation or accuracy of the prescription gain amplifier assembly. With brief reference to the error equations, it is observed that both contain the factor (Rtotal/R27 or Rserial/Rshunt). For smaller gain sections the serial resistors (R22,R24 ...) become very small in relation to the shunt resistors (R23,R25 ...), therefore the factor (Rserial/Rshunt) becomes negligible and thus the serial resistors may be eliminated entirely. This unexpected advantage represents a further simplification in the manufacture thereof in addition to a further reduction in the number of components.

The common connection to all of the illustrated switches may be returned to a reference voltage rather than to a ground potential. This aspect however, is a matter of choice and represents no limiting factor of the invention. Because the overall accumulated gain of amplifier 32 is greater than that of amplifier 34, it is preferable, for noise purposes, to arrange the amplifier sections such that the larger gain section preceeds the smaller gain section. In this manner, the amplified noise generated within amplifier 34, due to its smaller gain, becomes negligible with respect to the amplified noise of amplifier 32 added to that of amplifier 34.

FIG. 3 also illustrates that the L-pad ladder arrangement as hereinbefore discussed, may be used in a configuration which provides prescription attenuation rather than gain. This aspect of the invention is accomplished by the further use of switches S40 and S41. When the switches are configured to position A, the respective amplifiers operate in the unity gain mode to isolate the L-pad attenuator networks. The degree of attenuation is again determined by the setting of the various L-pad section switches. Configured as an attenuator, and for all the reasons discussed hereinbfore, the switches provide an accumulative attenuation depending on the particular combination of ladder sections activated by the respective switches.

While the physical nature of the disclosed L-pad switches are in the form of mechanical switches, those skilled in the art may find it desirable to use electrically operated switches or logic controlled solid state switches.

Thus, the invention herein disclosed provides precision selectable gain or attenuation settings through the use of the L-pad attenuator arrangement wherein each section thereof is comprised of a single pole switch and two resistors. Such an arrangement takes advantage of the minimal number of components in addition to a minimum number of switch interface wires necessary to connect the switches to the attenuator components.

Accordingly, what we claim is:

1. A prescription attenuator network, comprising a plurality of cascaded L-pad attenuator sections, each said section having a series and shunt impedance and a single switch with values selected so that the section input impedance is larger than the output impedance of the preceding section and the input impedance of each section is larger than the input impedance of the previous section in the network, and each attenuator section further includes an input and output terminal having connected therebetween said series impedance, and said shunt impedance is connected between said section output terminal and said switch so that upon activation thereof series impedance current is diverted away from subsequent attenuator sections to thereby produce a desired section attenuation, and multiple attenuator section activations produce a corresponding increase in the overall network attenuation.

2. The attenuator network as set forth in claim 1 wherein the impedance values of each section are selected so that the actual attenuation per section is slightly greater than it would be without error generating loading of said section by activated switches whereby a cumulative actual error generated by additional preceding activated sections tends to be distributed within a design error level range.

3. The attenttuator network as set forth in claim 2 wherein impedance values of each cascaded section are selected so that the slightly greater attenuation value designed into each section increases for sections of increasing attenuations.

4. The attenuator network as set forth in claim 1 wherein the input impedance of each cascaded section is selected so that the current drawn by any one activated section produces only a negligible error in the desired attenuation of preceding sections.

5. The attenuator network as set forth in claim 1 or 4 wherein the shunt impedance of attenuation sections having a small attenuation are selected to be of sufficient magnitude so that the respective serial impedances may be eliminated for a given accuracy specification.

6. The attenuator as set forth in claim 1 or 2 further including an operational amplifier connected to the attenuator network input terminal and a high impedance load comprised of said amplifier's inverting input terminal the combination of which provides prescription gains corresponding to particular combinations of activated attenuator network sections connected to the attenuator network output terminal.

* * * * *